(12) United States Patent
Ichitsubo et al.

(10) Patent No.: US 8,253,496 B2
(45) Date of Patent: Aug. 28, 2012

(54) LINEAR RF POWER AMPLIFIER WITH FREQUENCY-SELECTABLE IMPEDANCE MATCHING

(75) Inventors: Ikuroh Ichitsubo, Sagamihara (JP); Kanya Kubota, Higashi-Omi (JP); Shigeru Watanabe, Mitaka (JP); Brian Michael Wang, Palo Alto, CA (US)

(73) Assignee: Micro Mobio Corporation, Palo Alto, CA (US)

( * ) Notice: Subject to any disclaimer, the term of this patent is extended or adjusted under 35 U.S.C. 154(b) by 48 days.

(21) Appl. No.: 12/872,116

(22) Filed: Aug. 31, 2010

(65) Prior Publication Data

US 2010/0321110 A1    Dec. 23, 2010

Related U.S. Application Data

(63) Continuation-in-part of application No. 12/263,112, filed on Oct. 31, 2008, now Pat. No. 7,808,312.

(51) Int. Cl.
*H03F 3/191* (2006.01)
*H03G 3/20* (2006.01)
(52) U.S. Cl. ........................................ 330/302; 330/136
(58) Field of Classification Search ................ 330/133, 330/302, 306, 132, 136
See application file for complete search history.

(56) References Cited

U.S. PATENT DOCUMENTS

| | | | |
|---|---|---|---|
| 4,977,041 A | 12/1990 | Shiozawa | |
| 5,656,972 A | 8/1997 | Norimatsu | |
| 5,880,635 A | 3/1999 | Satoh | |
| 6,025,651 A | 2/2000 | Nam | |
| 6,151,509 A | 11/2000 | Chorey | |
| 6,262,630 B1 | 7/2001 | Eriksson | |
| 6,462,622 B1 | 10/2002 | Mori | |
| 6,625,050 B2 | 9/2003 | Suwa | |
| 6,678,506 B1 | 1/2004 | Dolman | |
| 6,798,287 B2 | 9/2004 | Wu | |
| 2004/0127185 A1 | 7/2004 | Abrahams | |
| 2004/0203552 A1 | 10/2004 | Horiuchi | |
| 2005/0239415 A1 | 10/2005 | Sagae | |
| 2007/0194853 A1* | 8/2007 | Mori et al. | 330/302 |

* cited by examiner

*Primary Examiner* — Robert Pascal
*Assistant Examiner* — Khiem Nguyen
(74) *Attorney, Agent, or Firm* — SV Patent Service

(57) ABSTRACT

A radio frequency (RF) amplifier circuit includes a first impedance matching circuit configured to receive an input RF signal, a control circuit configured to produce a band control signal according to the frequency of the input RF signal, an RF amplifier having its input connected to the first impedance matching circuit. The RF amplifier can produce an amplified RF signal in response to the input RF signal. A second impedance matching circuit can receive the amplified RF signal from the RF amplifier. At least one of the first impedance matching circuit and the second impedance matching circuit has an impedance that is adjustable by the band control signal. A multi-band filter can switch the amplified RF signal from the second impedance matching circuit to one of selectable narrow-band filters in response to the band control signal.

16 Claims, 16 Drawing Sheets

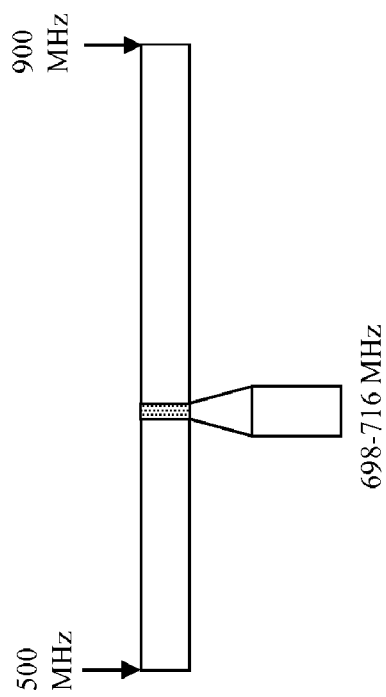
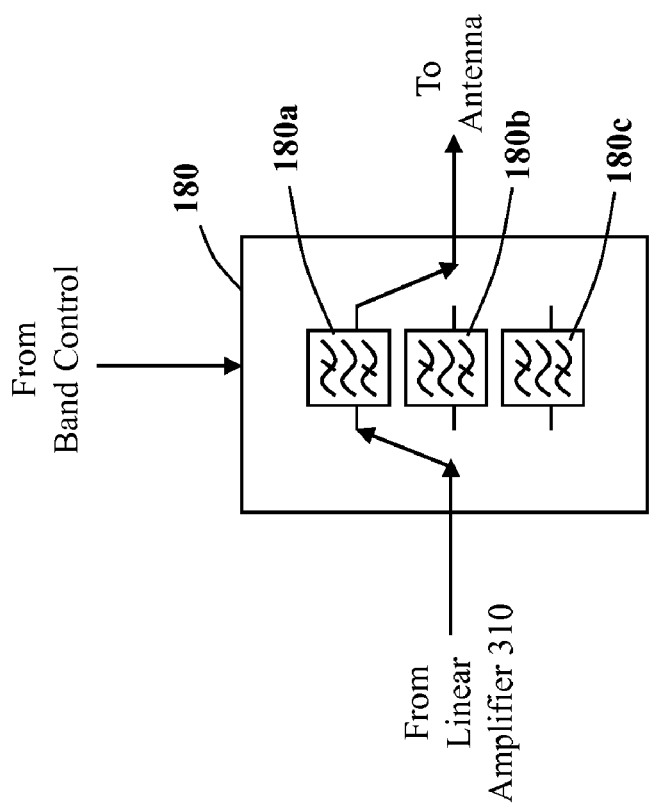
Figure 3B
Figure 3A

LINEAR RF POWER AMPLIFIER WITH FREQUENCY-SELECTABLE IMPEDANCE MATCHING

CROSS REFERENCES TO RELATED APPLICATIONS

The present application is a continuation-in-part application of U.S. patent application Ser. No. 12/263,112, titled "Broadband RF Linear Amplifier", filed on Oct. 31, 2008 now U.S. Pat. No. 7,808,312 by the present inventors, the content of which are incorporated herein by reference.

BACKGROUND

The present invention relates to radio frequency power amplifiers.

Portable devices such as laptop personal computers, personal digital assistants (PDA), mobile internet devices (MID), cellular phones, and so-called smart phones with wireless data communication capability are being developed in ever increasing functions and features for convenience access to internet. Correspondingly, electrical components thereof must also decrease in size while still providing effective radio transmission performance. A major component of a wireless communication device is the power amplifiers (PA). A PA can be fabricated on a single semiconductor integrated circuit (IC) chip to provide signal amplification with substantial power. However, the substantially high transmission power associated with radio frequency (RF) communication increases the difficulty of miniaturization of the transmission components.

One significant challenge for RF power amplifiers is to provide high linearity power amplification for an increasingly large number of RF frequency bands. International Telecommunication Union, for example, defines more than a dozen RF bands, as shown in Table I for International Mobile Telecommunications (IMT) standard. Each of Band I through Band XLI listed in Table I is a pair of single uplink band and single downlink frequency band. The single RF bands shown in Table I have bandwidths between 10-75 MHz. In other words, the bandwidth of a single RF bands defined by the IMT standard is commonly less than 4% of the center frequency of the respective band. Many of the single RF bands have non-overlapping frequency ranges.

To maintain amplification linearity, conventional power amplifiers usually can only cover the frequency range of a single RF band and possibly with two overlapping single RF bands. Conventional power amplifiers in general cannot cover the frequency range of two or more non-overlapping single RF bands, as defined by IMT and other RF wireless standards such as IMT-2000, WiMax, WiBro, and WiFi. For example, the bandwidth of a conventional power amplifier may be 5% or narrower than the center frequency of a single RF band. Due to the wide frequency range of non-overlapping single RF bands as described above, multiple power amplifiers are needed to operate at different RF frequency bands such as Band XII, Band XIII, Band XIV, and Band V, as shown in Table I.

TABLE I

IMT-FDD Single RF Bands for User Equipment

| Wireless Band | Uplink Frequencies (MHz) | Downlink Frequencies (MHz) |
|---|---|---|
| I | 1920-1980 | 2110-2170 |
| II | 1850-1910 | 1930-1990 |
| III | 1710-1785 | 1805-1880 |
| IV | 1710-1755 | 2110-2155 |
| V | 824-849 | 869-894 |
| VI | 830-840 | 865-875 |
| VII | 2500-2570 | 2620-2690 |
| VIII | 880-915 | 925-960 |
| IX | 1750-1785 | 1845-1880 |
| X | 1710-1770 | 2110-2170 |
| XI | 1428-1448 | 1476-1496 |
| XII | 698-716 | 728-746 |
| XIII | 777-787 | 746-756 |
| XIV | 788-798 | 758-768 |
| XV | 1900-1920 | 2600-2620 |
| XVI | 2010-2025 | 2585-2600 |
| XVII | 704-716 | 734-746 |
| XVIII | 815-830 | 860-875 |
| XIX | 830-845 | 875-890 |
| XX | 832-862 | 791-821 |
| . | . | . |
| . | . | . |
| . | . | . |
| XL | 2300-2400 | 2300-2400 |
| XLI | 3400-3600 | 3400-3600 |

Since most of the wireless devices are required to operate in multiple frequency bands, multiple power amplifiers typically have to be included in a single wireless device to provide linear amplification for each of the bands the wireless device operates in. The multiple power amplifiers therefore add significant complexity and cost to conventional wireless devices.

One technique to provide broadband application is to use "distributed amplifiers", which includes, for example, "N-gate traveling-wave amplifier". A series of low gain broadband amplifiers are cascade connected to provide increased gain. This technique, however, has many drawbacks such as complexity, large device size, gain loss for a large number of amplifiers, and difficulty for high volume production. The approach is also expensive and is not particularly suitable for mobile applications.

SUMMARY

In a general aspect, the present invention relates to a radio frequency (RF) amplifier circuit that includes a first impedance matching circuit that can receive an input RF signal; a control circuit that can produce a band control signal according to the frequency of the input RF signal; an RF amplifier having its input connected to the first impedance matching circuit, wherein the RF amplifier can produce an amplified RF signal in response to the input RF signal; a second impedance matching circuit that can receive the amplified RF signal from the RF amplifier, wherein at least one of the first impedance matching circuit and the second impedance matching circuit has an impedance that is adjustable by the band control signal; and a multi-band filter comprising a plurality of selectable narrow-band filters, wherein the multi-band filter can direct the amplified RF signal from the second impedance matching circuit to one of the selectable narrow-band filters in response to the band control signal.

Implementations of the system may include one or more of the following. The multi-band filter can include a first selectable narrow-band filter and a second selectable narrow-band filter, wherein the multi-band filter can selectively turn on the first selectable narrow-band filter and to turn off the second selectable narrow-band filter in response to the band control signal. The first selectable narrow-band filter and the second selectable narrow-band filter can be connected in a parallel circuit. At least one of the first impedance matching circuit and the second impedance matching circuit can include an inductor having an impedance that is adjustable by the band control signal. At least one of the first impedance matching circuit and the second impedance matching circuit can include a capacitor having a capacitance that is adjustable by the band control signal. At least one of the first impedance matching circuit and the second impedance matching circuit can include an inductor; a capacitor in parallel connection with the inductor; and a switch can connect or disconnect the capacitor from the parallel connection in response to the band control signal. At least one of the first impedance matching circuit and the second impedance matching circuit can include a first capacitor; a second capacitor in parallel connection with the first capacitor; and a switch that can connect or disconnect the second capacitor from the parallel connection in response to the band control signal. At least one of the first impedance matching circuit and the second impedance matching circuit can include a serial inductor, a serial capacitor, a shunt inductor, or a shunt capacitor, at least one of which having an impedance adjustable by the band control signal.

In yet another general aspect, the present invention relates to a radio frequency (RF) amplifier circuit that includes an input impedance matching circuit that can receive an input RF signal; a control circuit that can produce a band control signal according to the frequency of the input RF signal; a first RF amplifier having its input connected to the input impedance matching circuit, wherein the first RF amplifier can produce a first amplified RF signal in response to the input RF signal; a second RF amplifier that can produce a second amplified RF signal in response to the first amplified RF signal; an inter-stage impedance matching circuit coupled between the output of the first RF amplifier and the input of the second RF amplifier; and an output impedance matching circuit that can receive the second amplified RF signal from the second RF amplifier, wherein at least one of the input impedance matching circuit, the inter-stage impedance matching circuit, and the output impedance matching circuit has an impedance that is adjustable by the band control signal.

Implementations of the system may include one or more of the following. The RF amplifier circuit can further include a multi-band filter comprising a plurality of selectable narrow-band filters, wherein the multi-band filter can direct the amplified RF signal from the second impedance matching circuit to one of the selectable narrow-band filters in response to the band control signal. The multi-band filter can include a first selectable narrow-band filter and a second selectable narrow-band filter, wherein the multi-band filter can selectively turn on the first selectable narrow-band filter and to turn off the second selectable narrow-band filter in response to the band control signal. At least one of the input impedance matching circuit, the inter-stage impedance matching circuit, and the output impedance matching circuit can include an inductor having an impedance that is adjustable by the band control signal. At least one of the input impedance matching circuit, the inter-stage impedance matching circuit, and the output impedance matching circuit can include a capacitor having a capacitance that is adjustable by the band control signal. At least one of the input impedance matching circuit, the inter-stage impedance matching circuit, and the output impedance matching circuit can include: an inductor; a capacitor in parallel connection with the inductor; and a switch that can connect or disconnect the capacitor from the parallel connection in response to the band control signal. At least one of the input impedance matching circuit, the inter-stage impedance matching circuit, and the output impedance matching circuit can include a first capacitor; a second capacitor in parallel connection with the first capacitor; and a switch that can connect or disconnect the second capacitor from the parallel connection in response to the band control signal. At least one of the input impedance matching circuit, the inter-stage impedance matching circuit, and the output impedance matching circuit can include a serial capacitor, a serial inductor, a shunt capacitor, or a shunt inductor, at least one of which having an impedance adjustable by the band control signal. The frequency of the input RF signal can be defined by International Mobile Telecommunications (IMT), WiMax, WiBro, WiFi, 3GPP, or IMT-2000.

The disclosed linear amplifier circuits provide frequency-selectable impedance matching at different stages of a RF amplifier circuit, which broadens the bandwidth for linear RF power amplification.

The disclosed broad-band linear amplifier circuits are suitable to applications in various wireless modulation schemes and wireless communications standards.

BRIEF DESCRIPTION OF THE DRAWINGS

The following drawings, which are incorporated in and from a part of the specification, illustrate embodiments of the present specification and, together with the description, serve to explain the principles of the specification.

FIG. 3A is an exemplified schematic detailed diagram of the band selectable filter in FIG. 3 when the band selectable filter is switched to a first single RF band.

FIG. 3B shows the frequency spectrum of the first single RF band.

DETAILED DESCRIPTION

Figure 1:
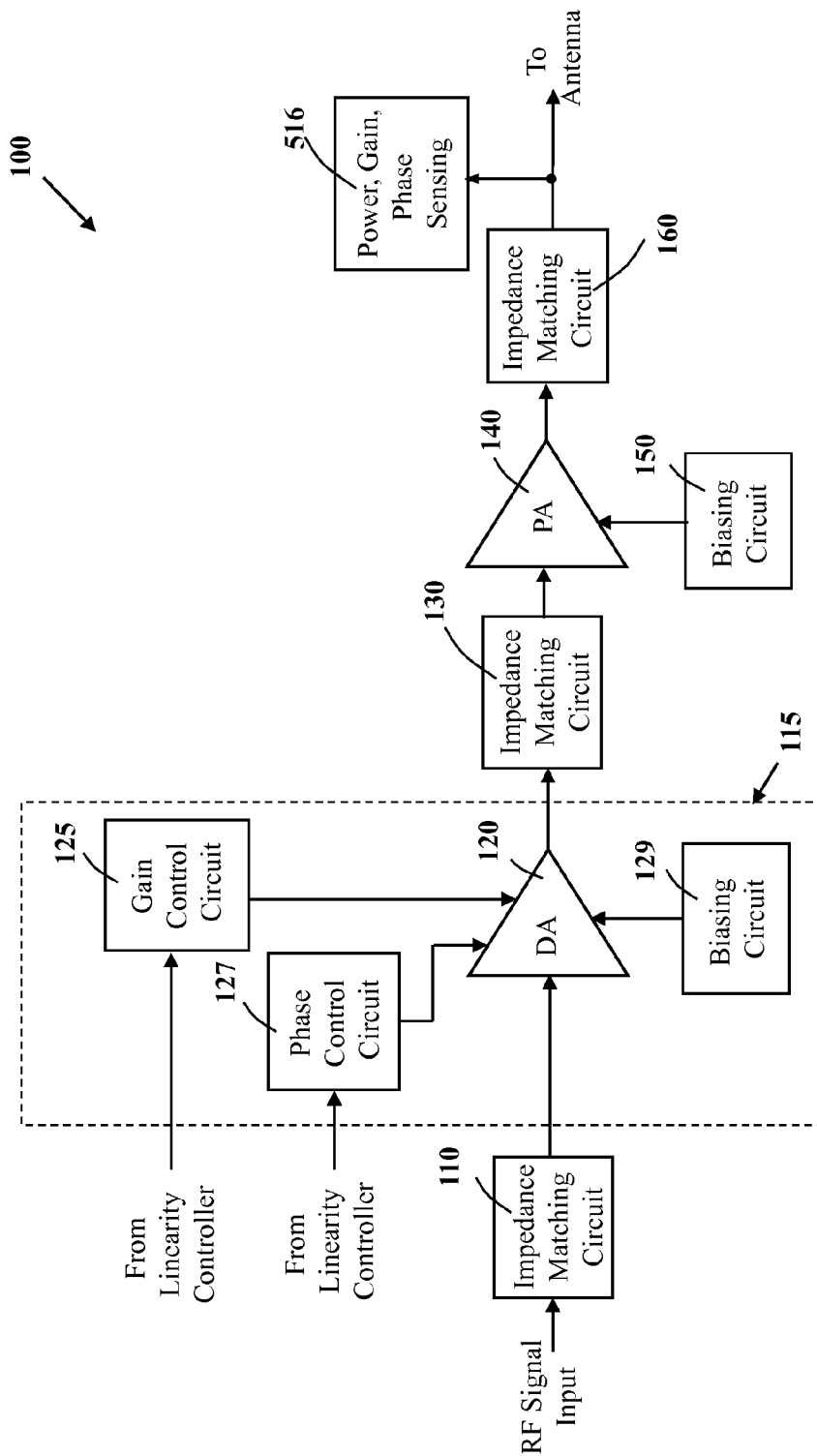
FIG. 1 is a schematic diagram for an exemplified broad-band linear amplifier circuit in accordance with the present specification.

A broad-band linear amplifier circuit 100, referring to FIG. 1, includes a matching circuit 110 and a power driving stage 115 that includes a driver amplifier (DA) 120, a gain control circuit 125, and a phase control circuit 127. The gain control circuit 125 and the phase control circuit 127 can respectively provide gain and phase controls to the driver amplifier 120. The gain control circuit 125 and the phase control circuit 127 receive control signals from a linearity controller that can be a base band processor (520 in FIG. 8 below) or a dedicated linearity control circuit. The broad-band linear amplifier circuit 100 also includes a matching circuit 130, a power amplifier (PA) 140, and a matching circuit 160. The bias of the power amplifier 140 is under the control of a biasing circuit 150.

Figure 1B:
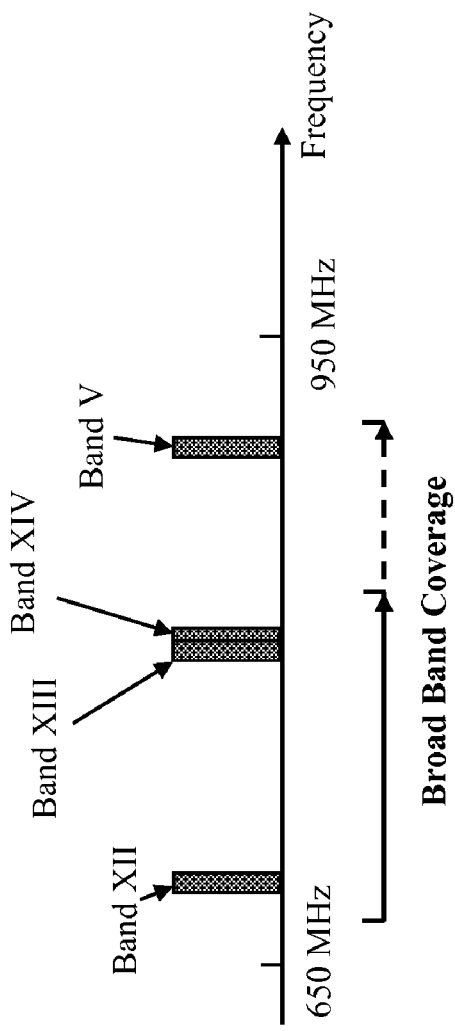
FIGS. 1B and 1C illustrate examples of broad bands covering the frequency ranges of multiple single RF bands.
Figure 1C:
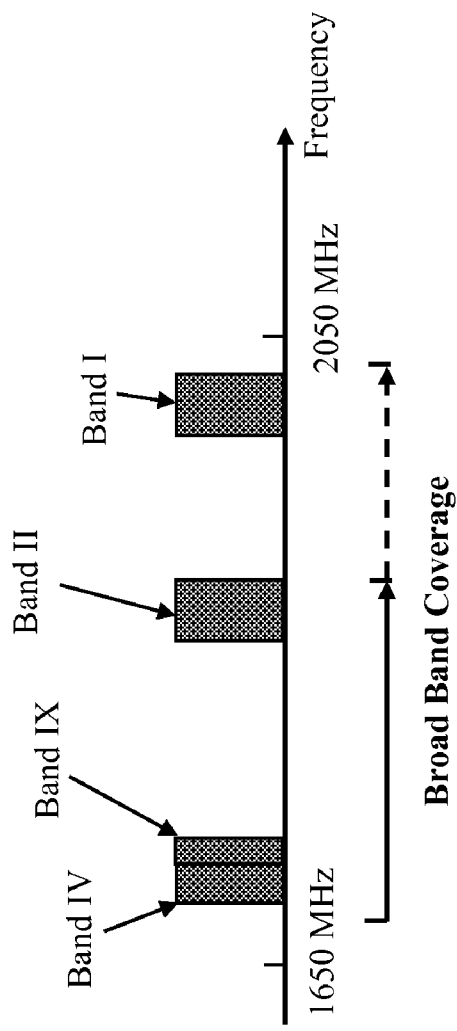

In the present specification, the term "broad band" is defined as an RF frequency band that spans the frequency range of at least two non-overlapping single RF bands as shown by one of the single IMT-FDD RF Frequency Bands listed in Table 1. For example, as shown in FIG. 1B, a broad band can cover the frequency range of the non-overlapping Band XII (698-716 MHz), Band XIII (776-788 MHz), and Band XIV (788-798 MHz) (uplink frequencies). In another example, as shown in FIG. 1B, another broad-band can cover the frequency range of the non-overlapping Band XII, Band XIII, Band XIV, and Band V (824-849 MHz). In another example, as shown in FIG. 1C, another broad band can cover the frequency range of the non-overlapping Band IV (1710-1755 MHz), Band X (1710-1770 MHz), Band IV (1750-1785 MHz), Band II (1850-1910 MHz), and Band I (1920-1980 MHz). Each of Band XII, Band XIII, Band XIV, Band V, Band IV, Band X, Band II, and Band I listed in Table I is a single RF (radio frequency) band. It should be understood that the single RF band can also be defined by standards other than IMT. A typical bandwidth for the disclosed broad-band power amplifier can cover up to 100 MHz and wider. A single RF band alone typically has a bandwidth of 75 MHz or narrower. A broad-band can have a bandwidth more than two times, three times, or five times of a bandwidth of a single RF band.

The matching circuit 110 can receive an input RF signal. The matching circuit 110 can match the input impedance of the driver amplifier 120. The driver amplifier 120 is biased by a biasing circuit 129 that inside to the driver amplifier 120. The driver amplifier 120 can amplify the signal from the matching circuit 110 and send a first amplified signal to the matching circuit 130. The matching circuit 130 can match the output impedance of the driver amplifier 120 and the input impedance of the power amplifier 140. The matching circuit 130 sends the first amplified signal to the power amplifier 140 that can generate a second amplified signal. The matching circuit 160 can match the output impedance of the power amplifier 140, and sends second amplified signal and produce an output RF signal.

Figure 8:
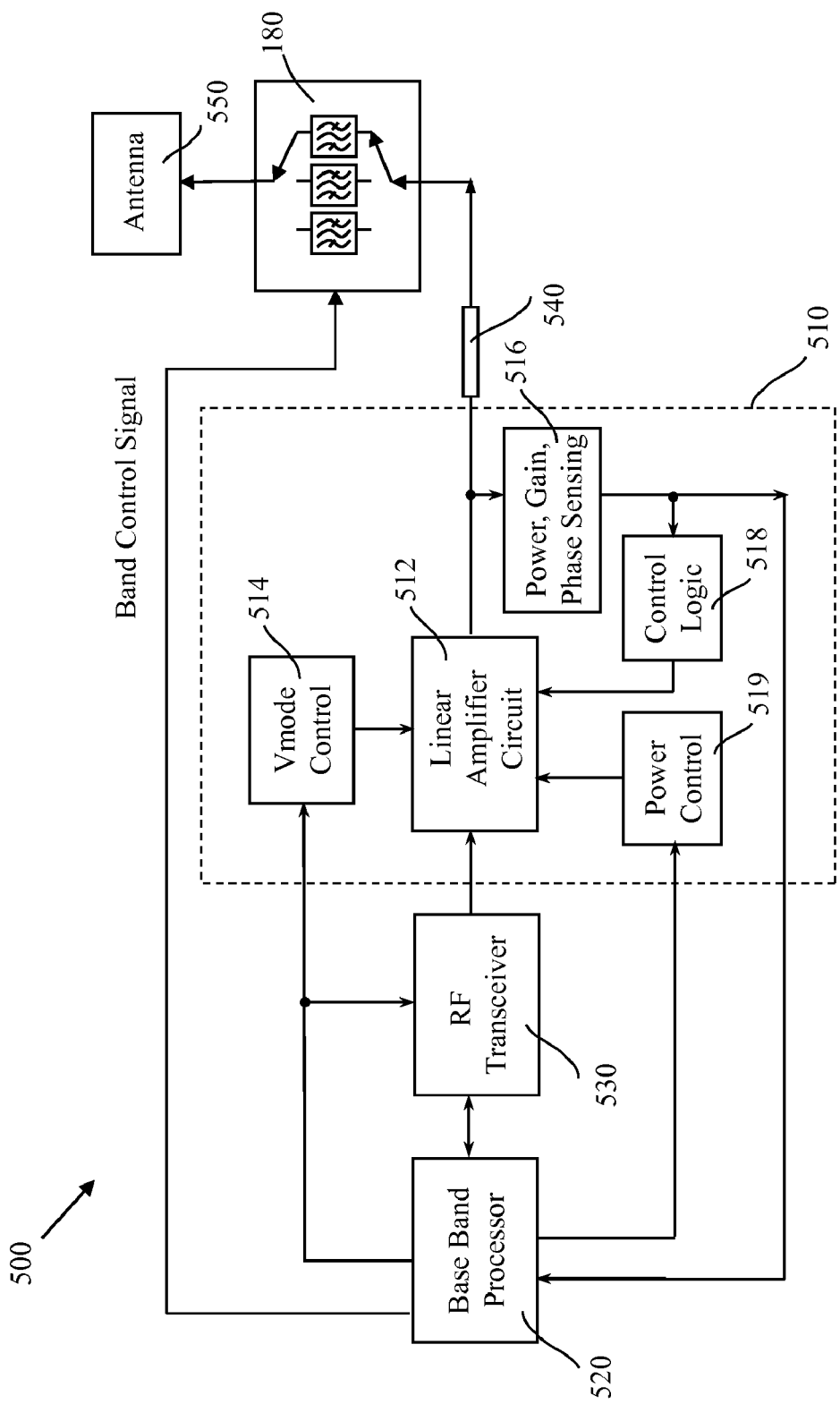
FIG. 8 illustrates an exemplified implementation of the efficient broad-band linear amplifier circuit in a wireless communication device in accordance with the present specification.

As discussed below in relation to FIG. 8 and a wireless communication device 500, a sensing circuit 516 can receive the output signal from the matching circuit 160, which can detect the power, the gain, and the phase of the output signal for linearity control. As discussed below in relation with FIGS. 6A and 6B, the gain control circuit 127 can improve gain linearity by compensating the gain expansion and compression between the driver amplifier 120 and the subsequent power amplifier 140. The phase control circuit 125 can correct or compensate for phase variations over a range of the output power. The gain control circuit 127, the phase control circuit 125, and the biasing circuit 129 can each receive the sensing signal as input for their respective control functions.

Referring to FIG. 1, the driver amplifier 120 and the power amplifier 140, with the assistance with the gain control circuit 125, the phase control circuit 127, and the sensing circuit 516 can provide power amplification with excellent linearity in each of the single RF bands within a broad band range. For example, the broad band can cover a frequency span ranging from 698 MHz to 915 MHz, which covers many frequency bands as shown Tables I and II. These exemplified single RF bands typically have their bandwidths approximately 5% or less of their respective center frequencies. The broad band, which these single RF bands collectively reside in, can span a frequency range having a width more than 15% of its center frequency. The broad band can have a bandwidth more two times, or three times of a bandwidth of the single RF bands residing in the broadband. In other words, the disclosed broadband linear RF amplifier can increase bandwidth by three or more times from the single RF band RF amplifiers.

Figure 2:
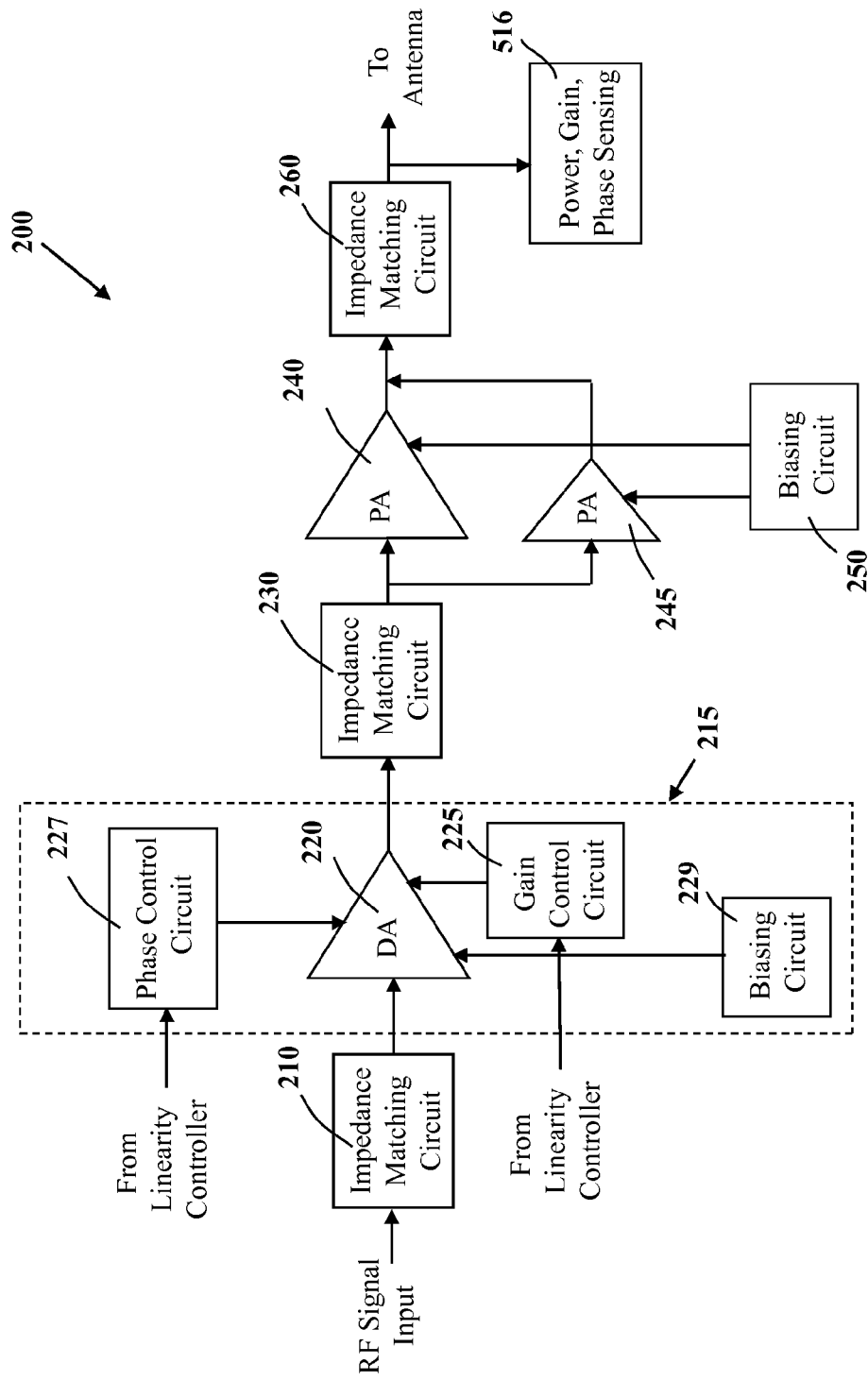
FIG. 2 is a schematic diagram for an exemplified broad-band linear amplifier circuit in accordance with the present specification.

In some embodiments, referring to FIG. 2, a broad-band linear amplifier circuit 200 includes a matching circuit 210 for the input signal and a power driving stage 215 that includes a driver amplifier 220, a gain control circuit 225, and a phase control circuit 227. The gain control circuit 225 and the phase control circuit 227 receive control signals from a linearity controller that can be a base band processor (520 in FIG. 8 below) or a dedicated linearity control circuit. The gain control circuit 225 and the phase control circuit 227 can respectively provide gain and phase controls to the driver amplifier 220. The driver amplifier 220 is biased by a biasing circuit 229 that can be internal in the driver amplifier 220. The broad-band linear amplifier circuit 200 also includes a matching circuit 230 for a first amplified signal from the driver amplifier 220, and a matching circuit 260 for the output signal. As discussed below in relation to FIG. 8 and a wireless communication device 500, a sensing circuit 516 can receive the output signal from the matching circuit 260, which can detect the power, the gain, and the phase of the output signal for linearity control.

The broad-band linear amplifier circuit 200 can also includes a main power amplifier 240 and an auxiliary power amplifier 245 which can be arranged in a parallel circuit. As discussed below in relation with FIGS. 6A and 6B, the gain control circuit 227 can improve gain linearity by compensating the gain expansion and compression between the driver amplifier 220 and the main power amplifier 240 and the auxiliary power amplifier 245. The phase control circuit 225 can correct or compensate for phase variations over a range of the output power.

A biasing circuit 250 can provide bias voltages the main power amplifier 240 and the auxiliary power amplifier 245. The biasing circuit 250 can produce a first bias signal for the main power amplifier 240 and a second bias signal for the auxiliary power amplifier 245. The main power amplifier 240 and the auxiliary power amplifier 245 can thus be activated separately to optimize the performances (power consumption, gain linearity, noise reduction, etc.) of the wireless communication device. The biasing circuit 250 can activate the main power amplifier 240 when the power of the output signal is to exceed a first threshold value. The biasing circuit 250 can deactivate the main power amplifier 240 when the power of the output signal is to be below a first threshold value. The auxiliary power amplifier 245 can be activated by the biasing circuit 250 at least when the power of the output signal is below a second threshold value. Optionally, the auxiliary power amplifier 245 can be activated by the biasing circuit 250 when the power of the output signal is to exceed the second threshold value. The first threshold value can be the substantially the same or below the second threshold value. As described below in more detail in relation to FIG. 8, the biasing circuit 250 can be controlled by a sensing signal in response to the output RF signal measured by a sensing circuit. The controls can also be determined by a base band processor 520.

The matching circuit 210 matches the input impedance of the driver amplifier 220. The driver amplifier 220 amplifies the input RF signal from the matching circuit 210 and sends a first amplified signal to the matching circuit 230. The matching circuit 230 matches the output impedance of the driver amplifier 220 and the input impedance of the power amplifier 240. The main power amplifier 240 and the auxiliary power amplifier 245, as described below, can coordinate the amplification tasks to produce amplified signals to be sent to the matching circuit 260. The matching circuit 260 can match the output impedance of the power amplifier 240 from the main power amplifier 240 and the auxiliary power amplifier 245 and produce an output signal. The impedance matching of the input and output signals is preferably based on the 50-ohm standard of the RF industry.

An advantageous feature of the improved and efficient broad-band linear amplifier circuit 200 is that the intermediate amplified RF signal from the driver amplifier 220 is impedance matched by the matching circuit 230 before it is received by the main power amplifier 240 and the auxiliary power amplifier 245. Since the main power amplifier 240 and the auxiliary power amplifier 245 can operate with high current flowing, non-zero impedance can induce can inject unwanted voltage noise during the intermediate amplification steps in the broad-band linear amplifier circuit. The impedance matching can therefore significantly minimize noise and unwanted signal oscillations.

The main power amplifier 240 or the auxiliary power amplifier 245 can include multiple stages of amplifiers. Moreover, the disclosed power amplifier module can include more than one auxiliary power amplifiers 245. For example, the disclosed power amplifier module can include two or three auxiliary power amplifiers that are connected in parallel with the main power amplifier. The different auxiliary power amplifiers can be activated at and below different threshold power levels of the output signal. For example, the power of the output signals may include three contiguous ranges that the main power amplifier and two auxiliary power amplifiers are responsible for amplifying from the high power rage to the low power range. In some embodiments, the disclosed power amplifier module is fabricated on an integrated circuit (IC) module that can be implemented on a single semiconductor chip.

Referring to FIG. 2, the driver amplifier 220, the main power amplifier 240, and the auxiliary power amplifier 245, with the assistance with the gain control circuit 225, the phase control circuit 227, and the sensing circuit 516, can provide power amplification with excellent linearity in each of the single RF bands within a broad band. For example, the broad band can cover a frequency span ranging from 400 MHz to 6000 MHz, or a range from 698 MHz to 798 MHz. These exemplified single RF bands typically have their bandwidths narrower than 5% of their respective center frequencies. The broad band, which these single RF bands collectively reside in, can span a frequency range having a width more than 100% of its center frequency.

Figure 3:
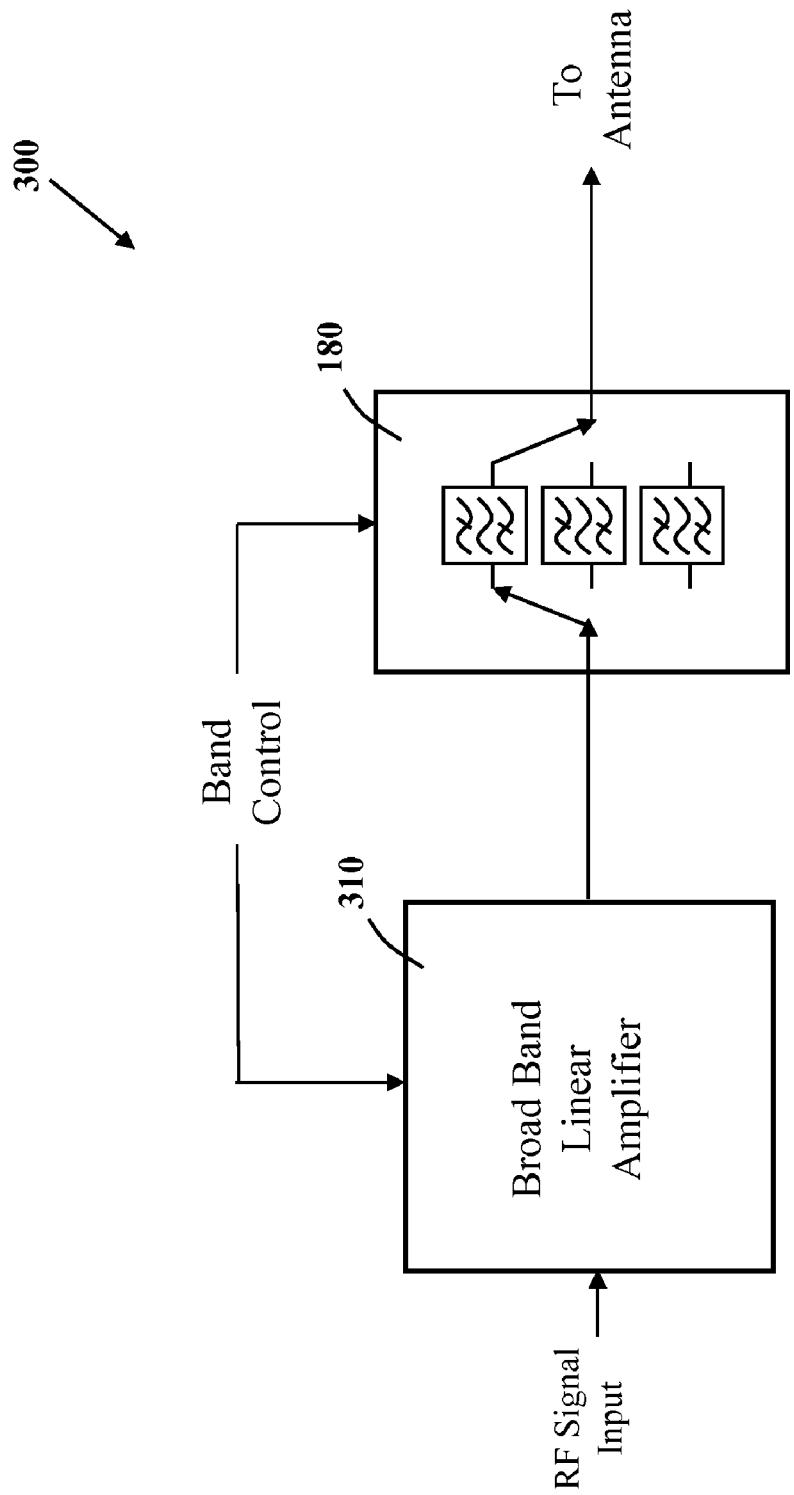
FIG. 3 is a schematic diagram for an exemplified broad-band linear amplifier circuit comprising a band selectable filter in accordance with the present specification.

Referring to FIG. 3, the broad-band linear amplifier circuit 300 includes a broad band linear amplifier 310 with its output coupled to a multi-band filter 180. The multi-band filter 180 receives output RF signals from the matching circuit 160 or 260. The multi-band filter 180 can filter the output RF signal to a frequency range covering a single RF band within the broad band covered by the broad-band linear amplifier circuit 310. The band switching is under the control of a band control signal from a control circuit which can be a base band processor (e.g. 520 in FIG. 8). The band control signal is used to select the frequency or the band of the multi-band filter 180 and to select the frequency of the impedance matching circuit. The output RF signal is then sent the RF output signal to an antenna for transmission.

Details of operations of the multi-band filter 180 are illustrated in FIGS. 3A-3F. The multi-band filter 180 includes multiple selectable narrow-band filters 180a-180c. The selectable narrow-band filter 180a-180c can, for example, be implemented by LC circuits with a switch, or with variable capacitors. Examples of variable capacitors and electrical mechanical resonators include surface acoustic wave (SAW) filters, Ferro-electric types, Varactor (Varicaps), diodes, RF MEMs, or capacitors with switches, etc. The capacitance or the inductance can be digitally controlled by the band control signal to vary the resonance frequency of the selectable narrow-band filter 180a-180c. The selectable narrow-band filter 180a-180c can be connected in a parallel circuit to allow one of them to be turned on at each time. It should be understood that the selectable narrow-band filter 180a-180c can be implemented by other electronic designs and electronic components without deviating from the spirit of the present invention.

In one example, as shown in FIGS. 3A and 3B, the broad-band linear amplifier circuit 300 amplifies an RF signal in a first single RF band in 698-716 MHz (which Band XII). The selectable narrow-band filter 180a is tuned to select the first single RF band to allow the output RF signal within 698-716 MHz to pass. The selectable narrow-band filters 180b, 180c are tuned off, blocking RF signals outside of the first single RF band.

Figure 3D:
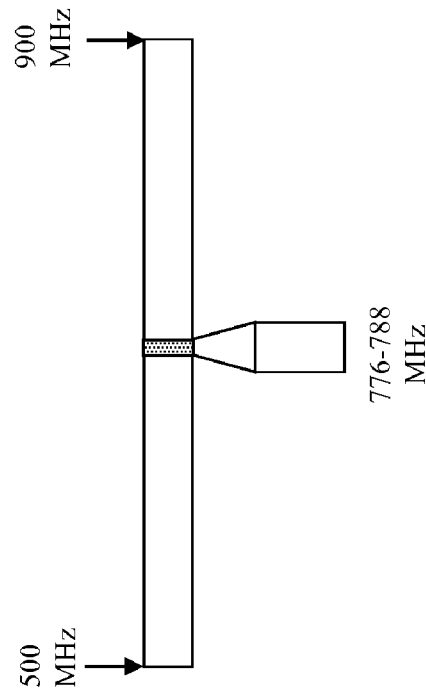
FIG. 3D shows the frequency spectrum of the second single RF band.
Figure 3C:
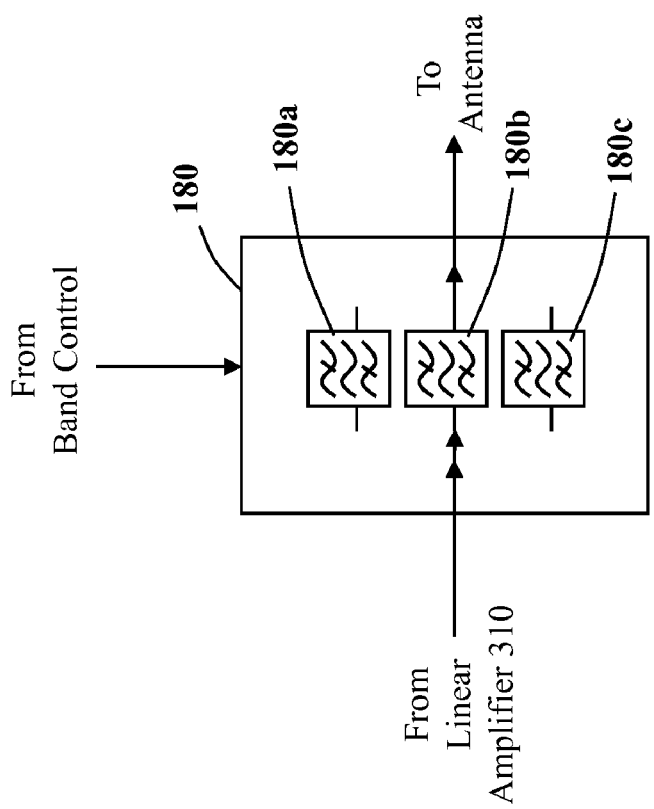
FIG. 3C is an exemplified schematic detailed diagram of the band selectable filter in FIG. 3 when the band selectable filter is switched to a second single RF band.

Next, referring to FIGS. 3C and 3D, the broad-band linear amplifier circuit 100 or 200 amplifies an RF signal in a second single RF band in 776-788 MHz (which covers Band XIII). The selectable narrow-band filter 180b is tuned to select in the second single RF band to allow the output RF signal within 776-788 MHz to pass. The selectable narrow-band filters 180a, 180c are tuned off, blocking RF signals outside of the second single RF band.

Figure 3F:
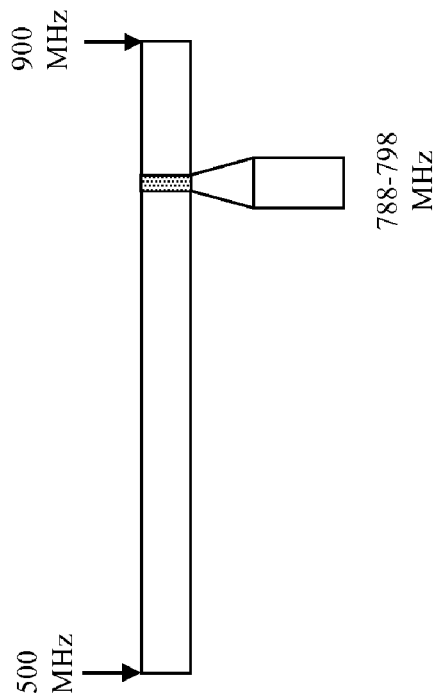
FIG. 3F shows the frequency spectrum of the third single RF band.
Figure 3E:
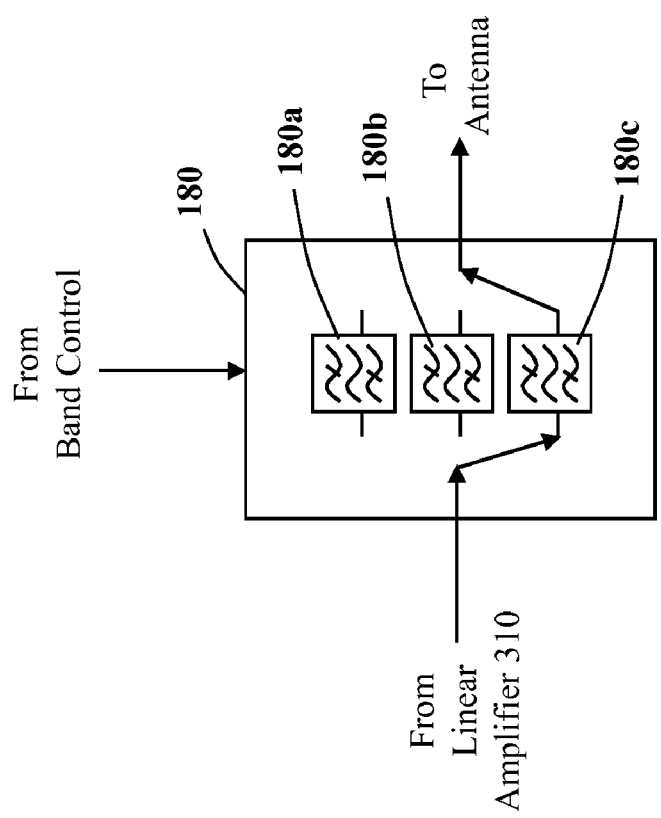
FIG. 3E is an exemplified schematic detailed diagram of the band selectable filter in FIG. 3 when the band selectable filter is switched to a third single RF band.

Similarly, referring to FIGS. 3E and 3F, the broad-band linear amplifier circuit 100 or 200 amplifies an RF signal in a third single RF band in 788-798 MHz (which Band XIV). The selectable narrow-band filter 180c is tuned to select the third single RF band to allow the output RF signal within 788-798 MHz to pass. The selectable narrow-band filters 180a, 180b are tuned off, blocking RF signals outside of the second single RF band.

Figure 3G:
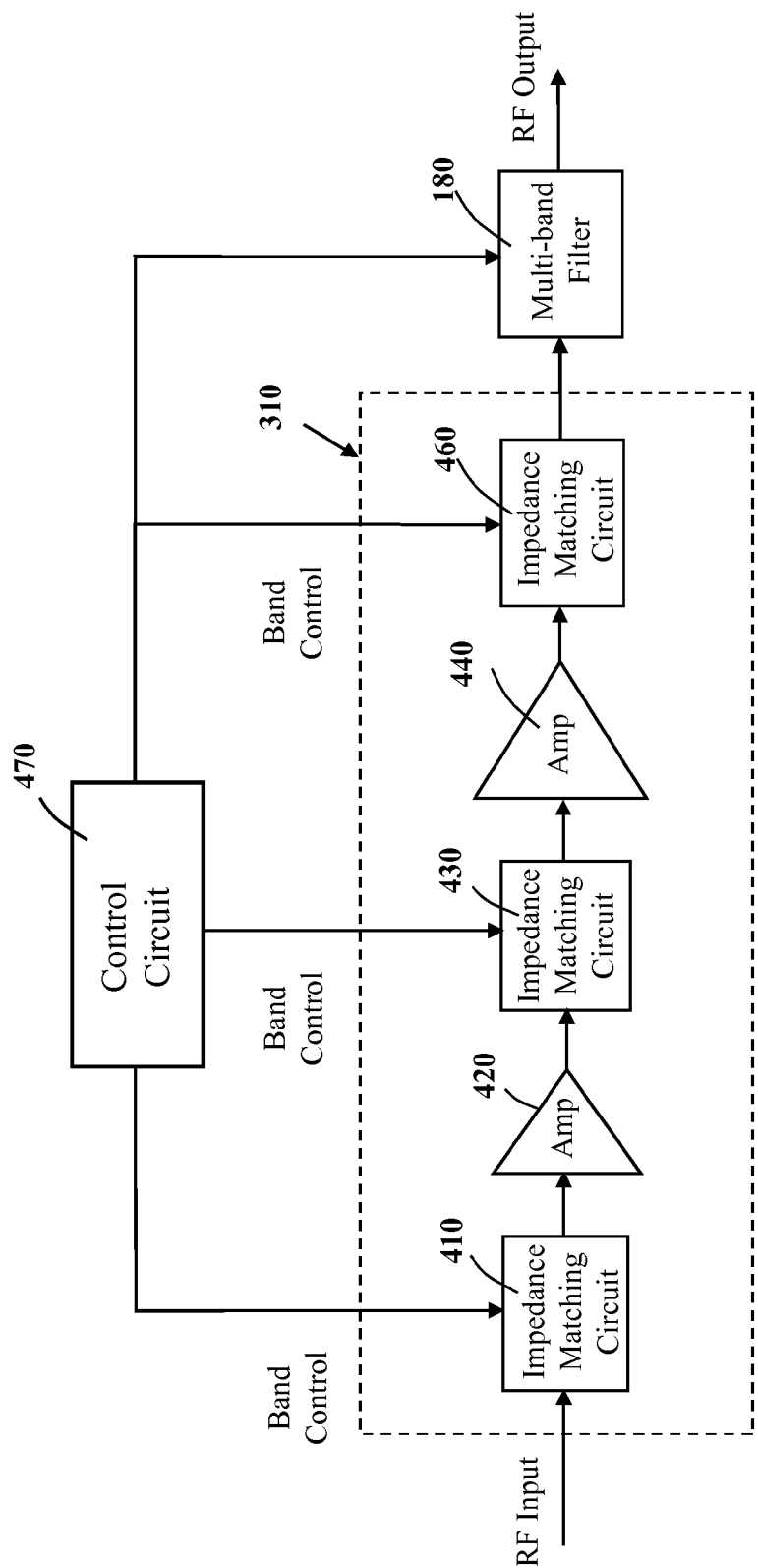
FIG. 3G illustrates another exemplary power amplifier circuit in accordance to an aspect of the present invention.

An exemplified circuit layout for the broad band linear amplifier 310 is shown in FIG. 3G. The power amplifier circuit 310 includes an input impedance matching circuit 410, a first RF amplifier 420, an inter-stage impedance matching circuit 430, a second RF amplifier 440, and an output impedance matching circuit 460. The amplified RF signal output by the impedance matching circuit 460 is sent to the multi-band filter 180. A band control signal can dynamically adjust the impedance of the impedance matching circuits 410, 430, 460 according to the frequency of the RF signals being amplified. The band control signal can be produced by a control circuit 470, which can for example be a base band processor (e.g. 520 in FIG. 8). The multi-band filter 180, as described above, includes a plurality of selectable narrow-band filters which can be selected and switched to under the control of the band control signal.

Figure 3I:
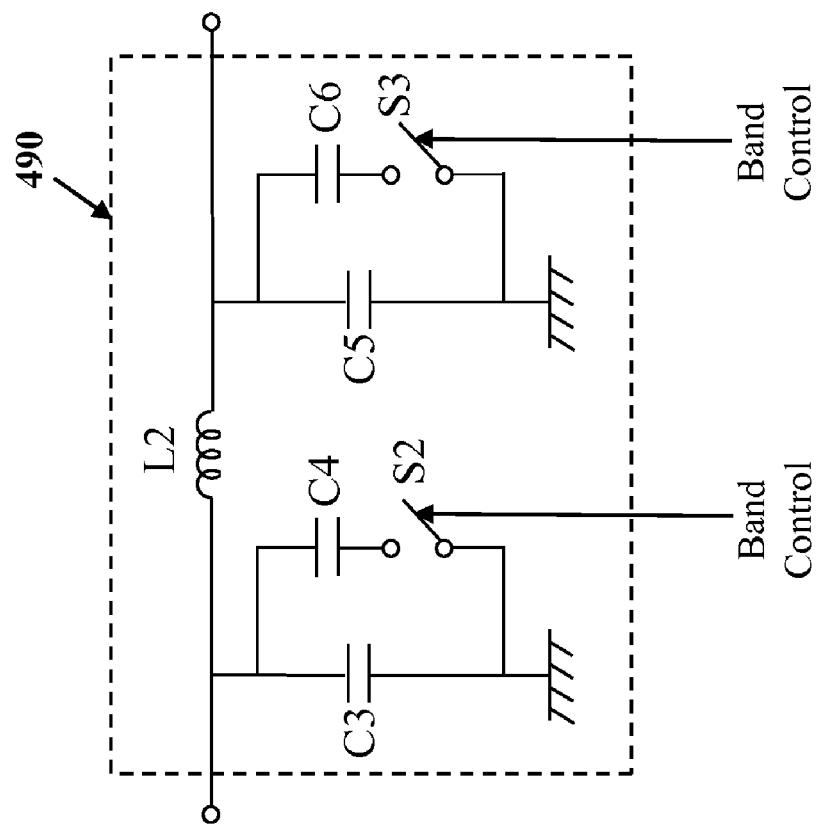
FIGS. 3H and 3I are schematic diagrams of exemplified frequency-selectable impedance matching circuits.
Figure 3H:
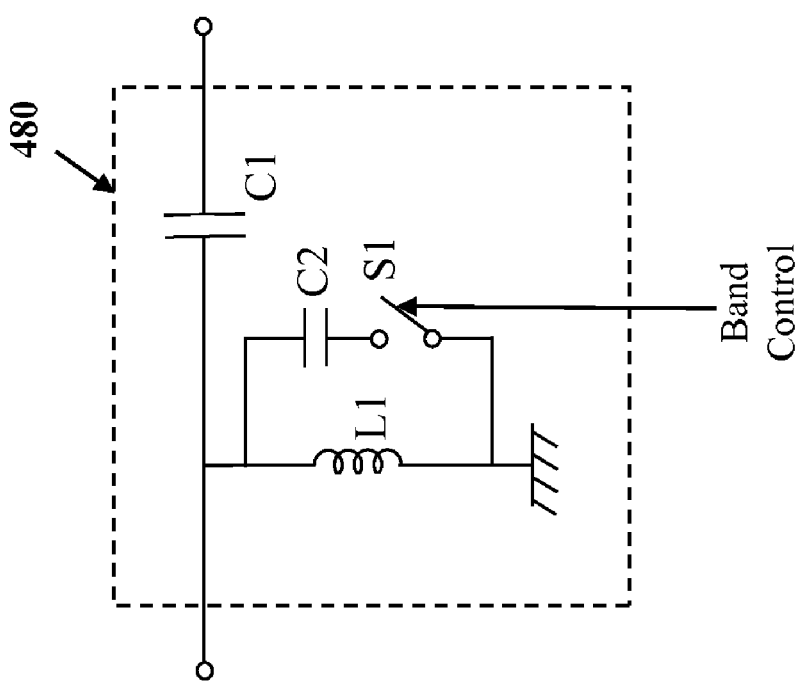

An example for the impedance matching circuits 410, 430, 460 is shown in FIG. 3H. A frequency-selectable impedance matching circuit 480 includes a high-pass type L-C circuit, which comprises a serial capacitor C1 and a shunt inductor L1. A capacitor C2 is connected in parallel to the shunt inductor L1. The connection of the capacitor C2 is controllable by a switch S1 that is in turn controlled by the band control signal. The impedance of the shunt inductor L1 can be modified by the presence or the absence of C2, and can thus provide frequency selection in the impedance matching circuit.

Another example for the impedance matching circuits 410, 430, 460 is shown in FIG. 3I. A frequency-selectable impedance matching circuit 490 includes shunt capacitors C3 and C5, and a serial inductor L2. The frequency-selectable impedance matching circuit 490 is a low-pass type C-L-C circuit. The shunt capacitor C3 is coupled with a parallel capacitor C4. The connection of C4 can be controlled by the band control signal through a switch S2. By including or excluding the capacitance of C4, the band control signal can adjust the capacitance of C3, and thus optimize impedance matching of the frequency-selectable impedance matching circuit 490 specific to the frequency of the amplified RF signal. Similarly, the shunt capacitor C5 is coupled with a parallel capacitor C6 that is controlled by the band control signal through a switch S3. The capacitance of C5 can be modified by including or excluding the capacitance of C6 for impedance optimization specific to the RF frequency.

Figure 4:
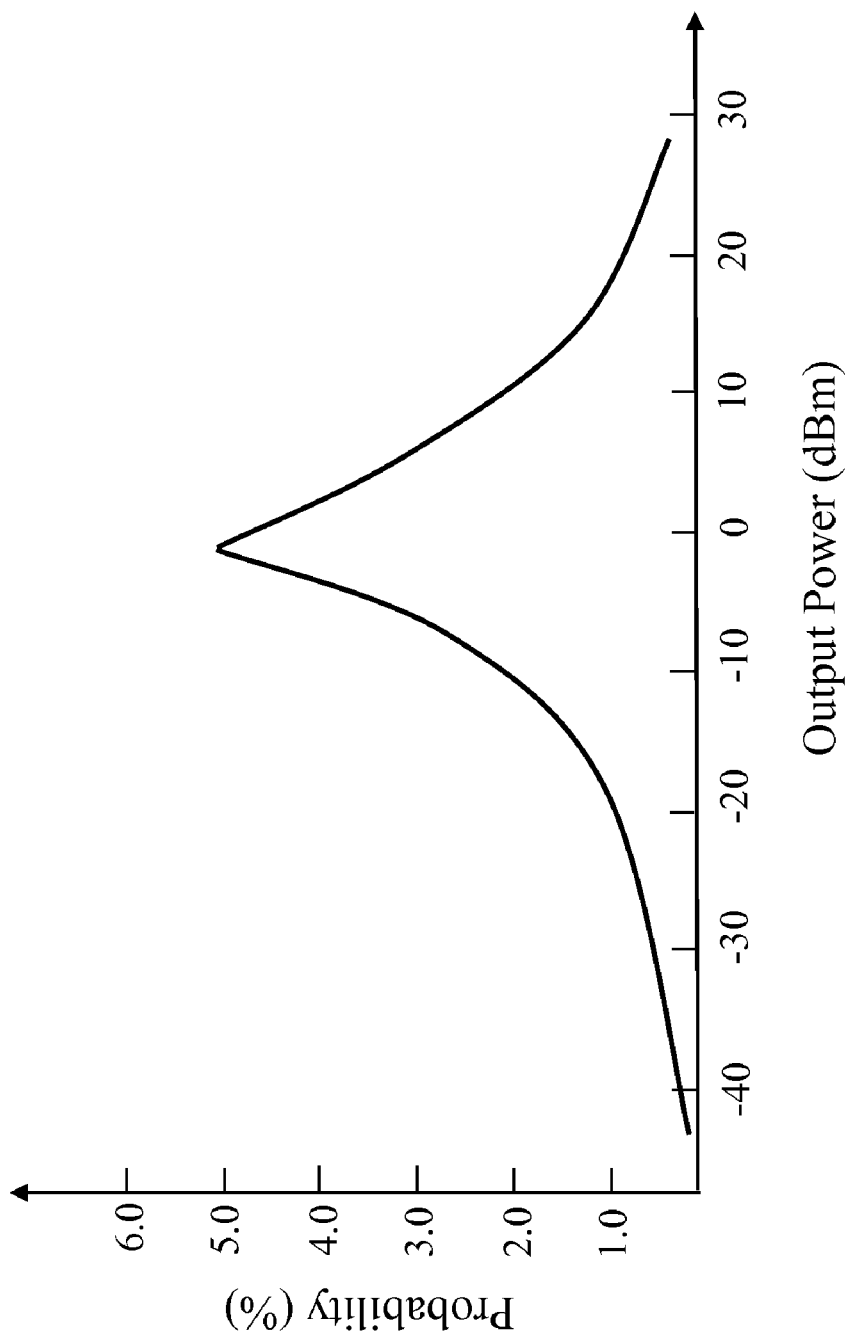
FIG. 4 shows an exemplified probability distribution for output power of a wireless communication protocol in a geographic environment.

Referring back to FIG. 2, the main power amplifier 240 and the auxiliary power amplifier 245 can be fabricated and controlled in accordance to the probability distribution of the output power in wireless communication devices that incorporates the broad-band linear amplifier circuit 200. FIG. 4 illustrates an exemplified probability distribution for output power of a wireless communication protocol in a geographic environment. The probability for output power is peaked at a certain output power value and falls off above and below the peak output power. The exact value of the peak output power and the shape of the fall-off curves depend on the wireless communication protocol as well as the geographic environment such as an urban area or a rural area.

The main power amplifier 240 can be fabricated in large dimensions such that it can handle the amplification of high power output. The auxiliary power amplifier 245 on the other hand can be fabricated in smaller dimensions to allow it to handle the amplification of low power signals. The main power amplifier 240 can be activated by the biasing circuit 250 when the output signal is at high power. The auxiliary power amplifier 245 can be activated by the biasing circuit 250 when the output signal is at low power. The output power, as described above and more in detail below, can be measured by a sensing circuit. The sensing signal produced by the sensing circuit can be directly fed to control the biasing circuit, or to a base band processor that can determine the proper control to biasing circuit based on the calculation of the power level and other quality factors of the output RF signal.

The auxiliary power amplifier 245 generally consumes much less power than the main power amplifier 240. Because the main power amplifier 240 can be turned off when the output power is at low level, the power consumption can be significantly decreased for the wireless communication device.

In accordance with the present specification, the main power amplifier 240 and the auxiliary power amplifier 245 can be fabricated to optimize power management performance specific to the geographic environment. For example, if a wireless communication device such as a cellular phone is to be used in the Asian market, the functionalities of the main power amplifier 240 and the auxiliary power amplifier 245 can be tailored to the specific probability distribution for output power in the Asian market. For example, if a geographic market includes higher density of wireless transmission base stations which requires of lower output power from the user terminals, the main power amplifier can be tailored to smaller dimensions. The geographic markets can also include suburban versus urban applications. For example, the main power amplifier and the auxiliary power amplifier can be fabricated with a size ratio in a range between 1:1 and 100:1, such as approximately 7:1, which can cover power ranges differing by about 5 dB.

Figure 5A:
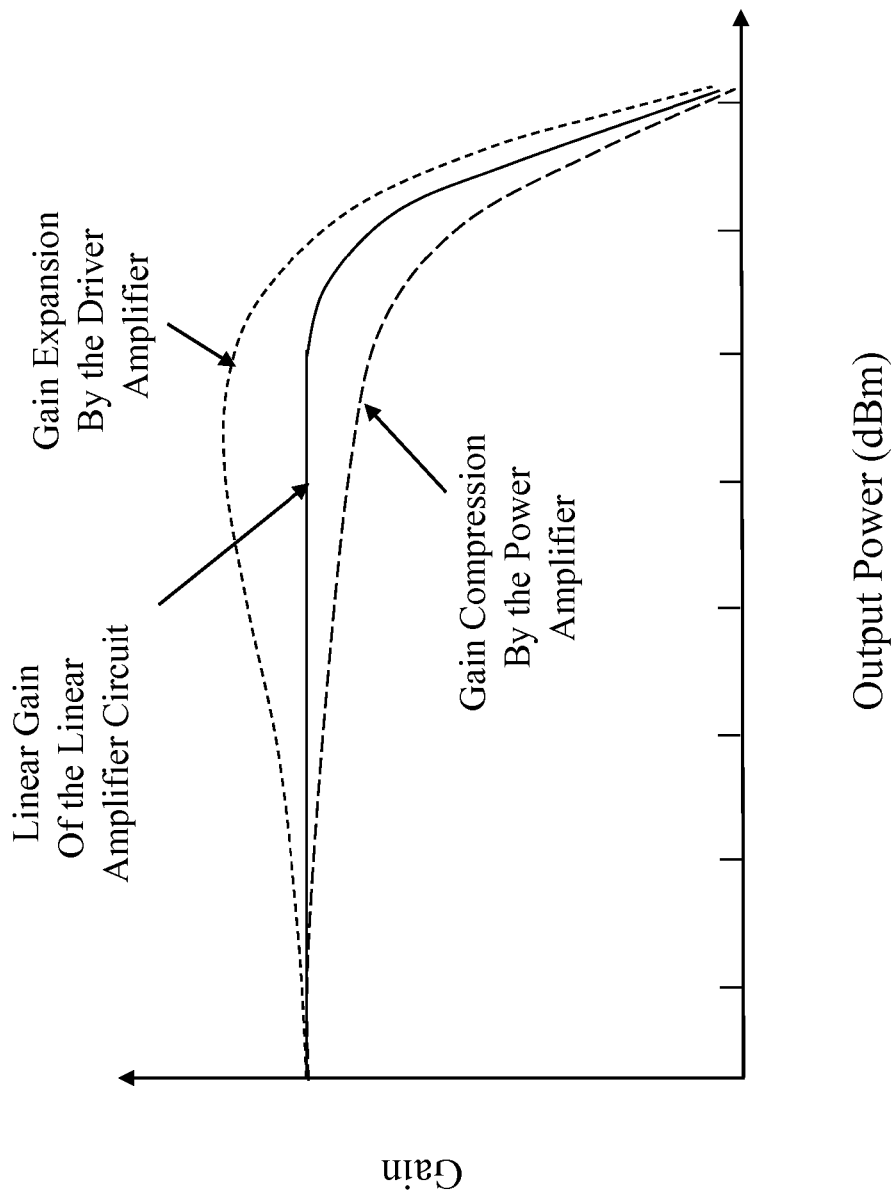
FIG. 5A illustrates an implementation of achieving linear gain using gain compensation in the broad-band linear amplifier circuit of FIGS. 1-3I.
Figure 5B:
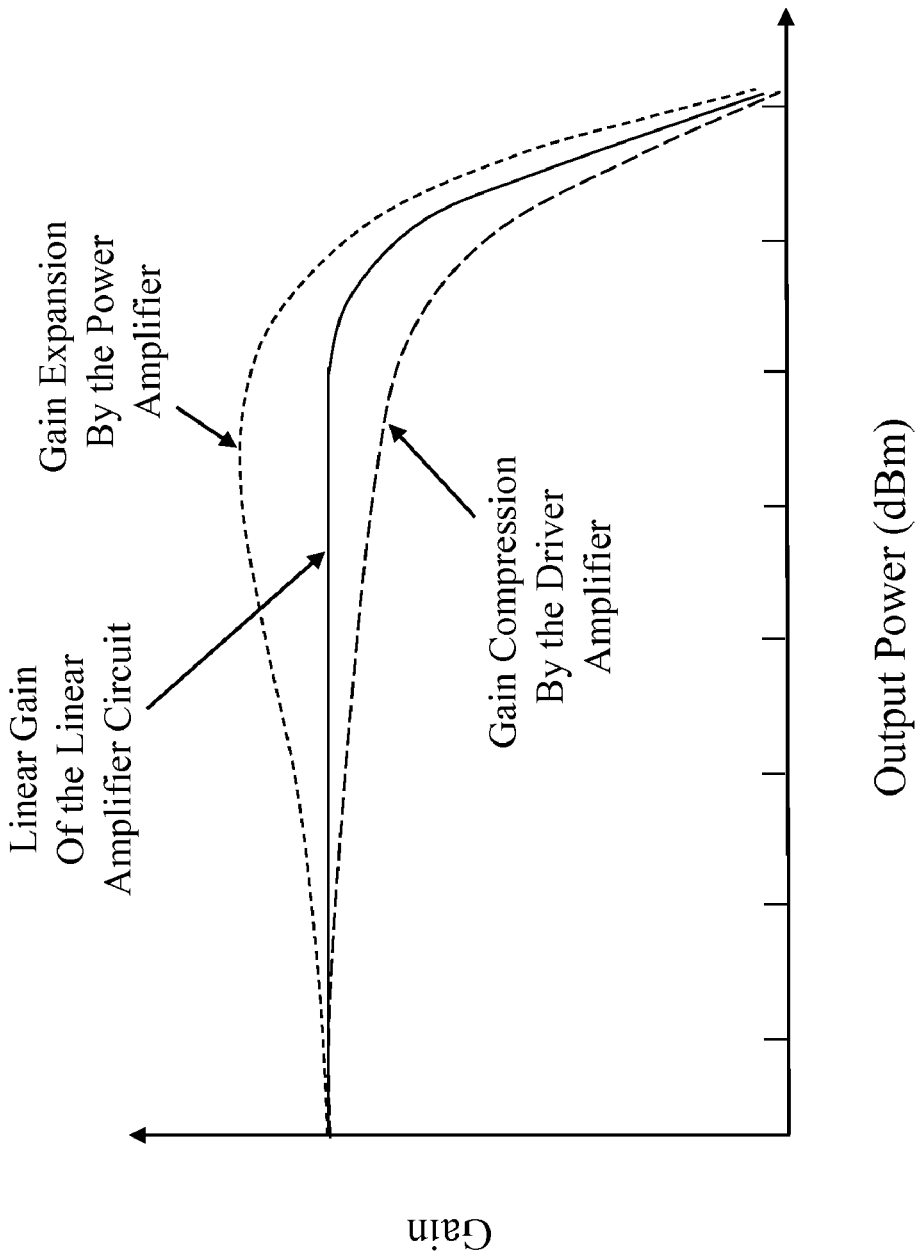
FIG. 5B illustrates another implementation of achieving linear gain using gain compensation in the broad-band linear amplifier circuit of FIGS. 1-3I.

In some embodiments, the disclosed linear power amplifying circuits 100 and 200 can improve gain linearity using gain compensation. Referring to FIGS. 1-2 and 5A, the driver amplifier 120 or 220 can introduce gain expansion while the power amplifier (PA) 140, or the main power amplifier 240 and the auxiliary power amplifier 245 perform gain compression. The combined effects of the gain expansion and gain compression allow the broad-band linear amplifier circuit 100 or 200 to achieve gain linearity in a wide range of output power. Alternately, referring to FIGS. 1-2 and 5B, the driver amplifier 120, 220 can introduce gain compression, if the power amplifier 140, or the main power amplifier 240 and the auxiliary power amplifier 245 perform gain expansion. The combined effects of the gain expansion and gain compression allow the broad-band linear amplifier circuits 100, 200 to achieve gain linearity in a wide range of output power.

Figure 6A:
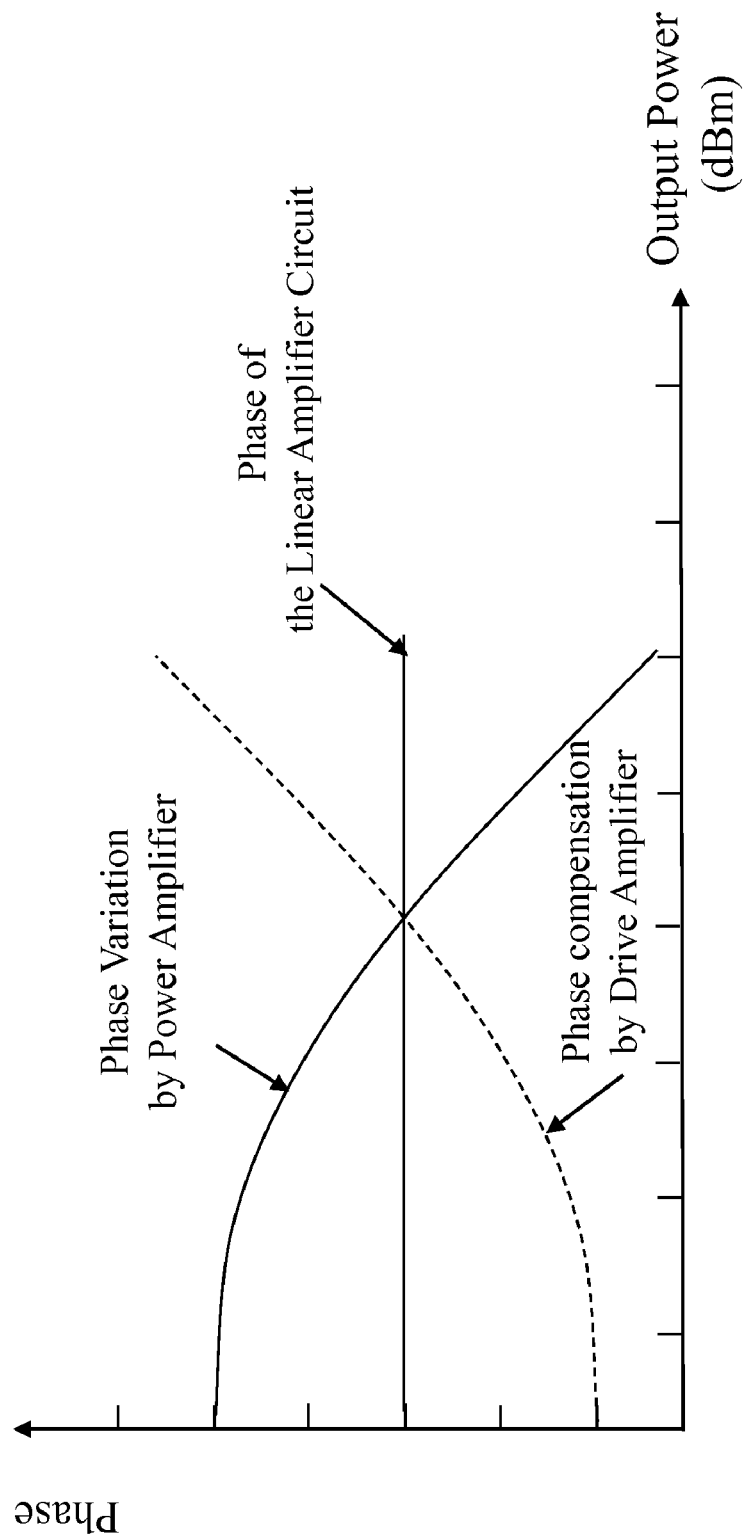
FIG. 6A illustrates an implementation of achieving linearity using phase compensation in the broad-band linear amplifier circuit of FIGS. 1-3I.
Figure 6B:
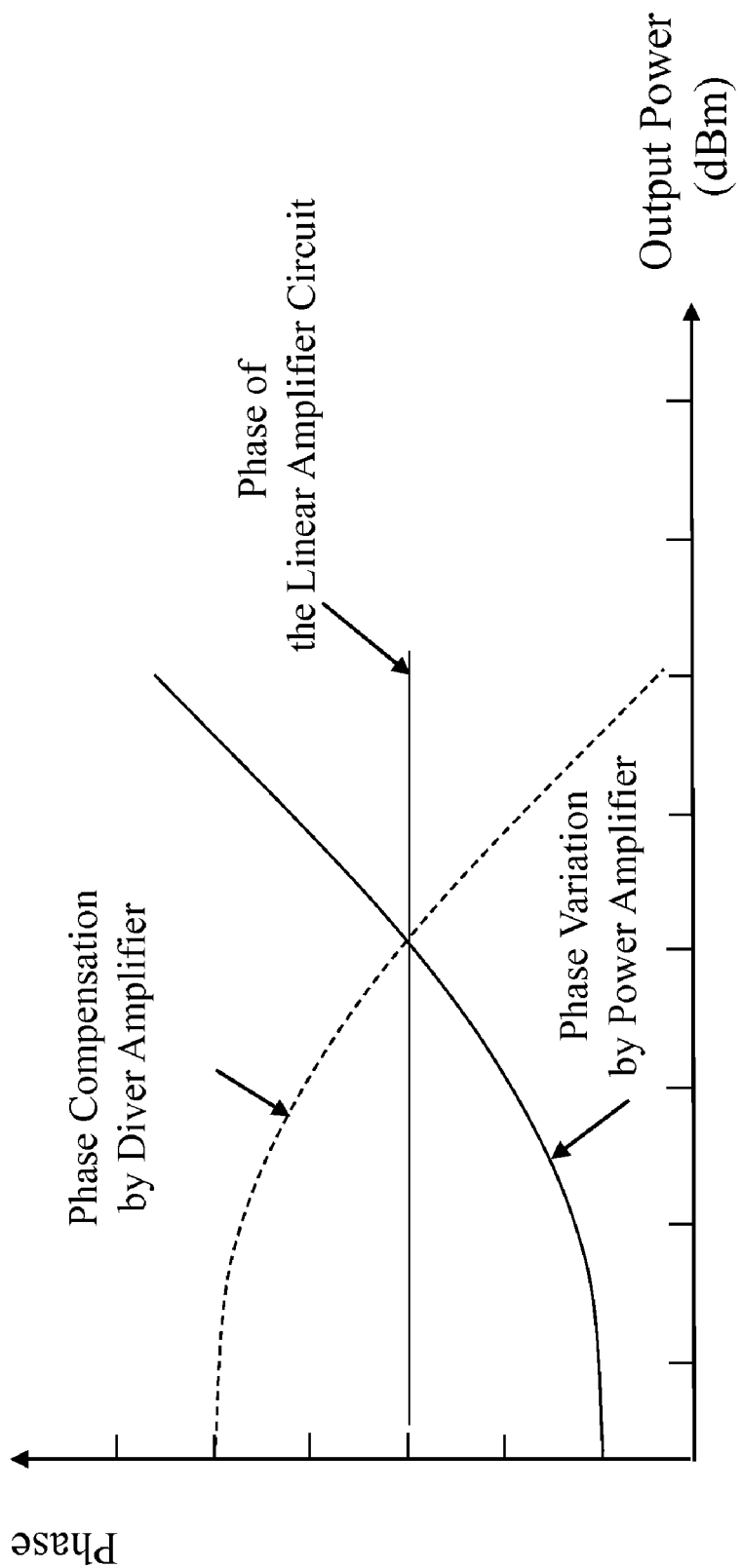
FIG. 6B illustrates another implementation of achieving linearity using phase compensation in the broad-band linear amplifier circuit of FIGS. 1-3I.

In some embodiments, the disclosed broad-band linear amplifier circuits 100, 200 can improve gain linearity using phase compensation or correction. Referring to FIGS. 1-2 and 6A, the phase of the amplified signal of the power amplifying circuits 100, 200 can vary over a range of the output power. Specifically the phase is shown to decrease with an increase in the output power. The phase control circuits 127, 227 can produce phase-compensation signals that increase with the output power. The phase-compensation signals are respectively sent to the driver amplifier 120, 220 to compensate the phase variations. Similarly, referring to FIG. 6B, the phase of the amplified signal of the power amplifying circuits 100, 200 can increase with an increase in the output power. The phase control circuits 127 and 227 can produce phase compensation signals that decrease with the output power. The phase compensation signals are respectively sent to the driver amplifier 120, 220 to compensate the phase variations.

In some embodiments, the phase of the amplified signal from the power amplifying circuits 100, 200 can both increase and decrease as a function of the output power. Phase compensation can be generated to dynamically compensate over each segment of the output power. The phase compensation can be dependent on the magnitude, the polarity, and the rate of change in the phase variations.

Referring to FIGS. 1, 2, and 5A, the driver amplifier 120, 220 can introduce gain expansion while the power amplifier 140, or the main power amplifier 240 and the auxiliary power amplifier 245, can perform gain compression. The combined effects of the gain expansion and gain compression allow the broad-band linear amplifier circuit 100 or 200 to achieve gain linearity in a wide range of output power. Alternately, referring to FIGS. 1, 2, and 5B, the driver amplifier 120, 220 can introduce gain compression while the power amplifier 140, or the main power amplifier 240 and the auxiliary power amplifier 245 can perform gain expansion. The combined effects of the gain expansion and gain compression allow the broad-band linear amplifier circuits 100, 200 to achieve gain linearity in a wide range of output power.

Figure 7:
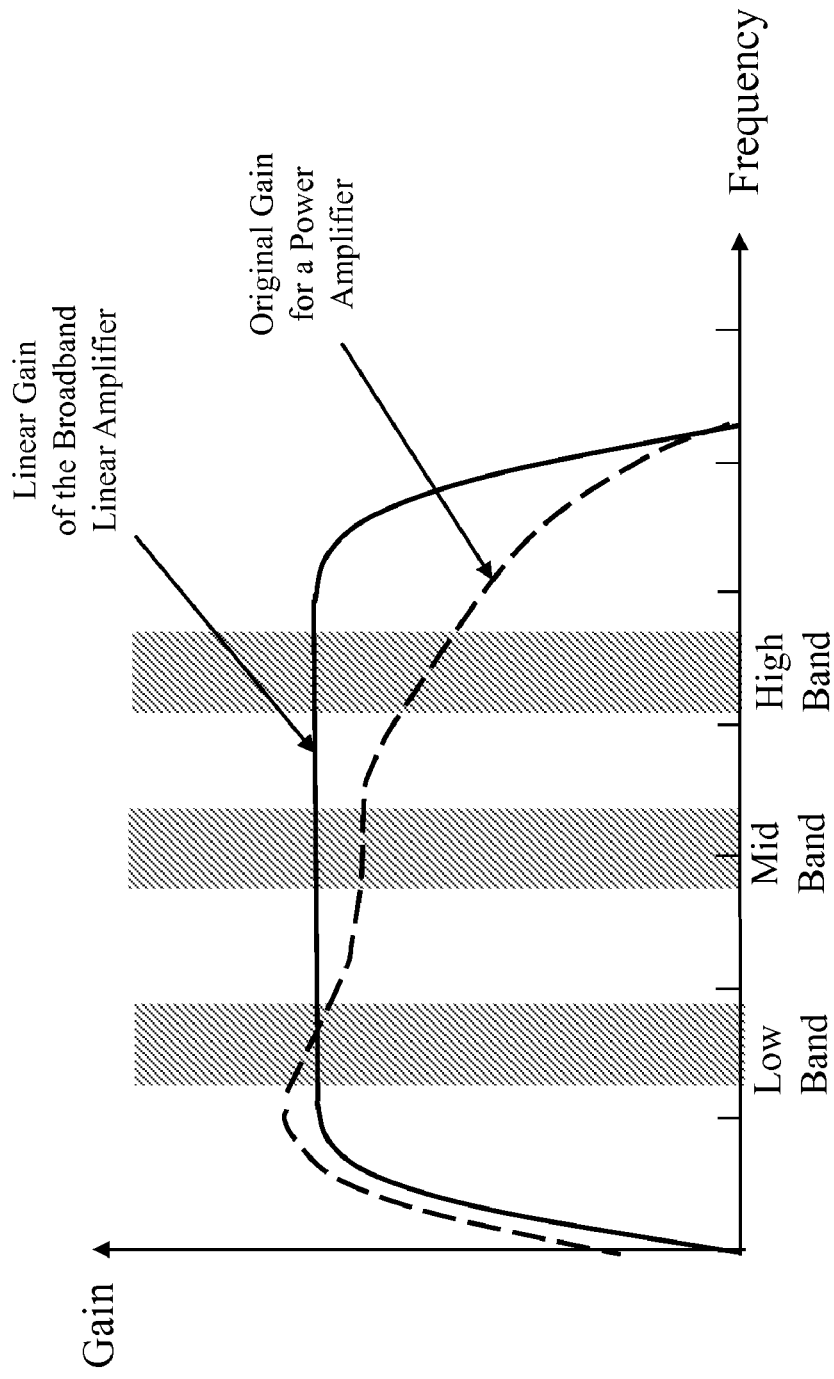
FIG. 7 illustrates band broadening in a wireless communication device in accordance with the present specification.

The band broadening benefits of the broad-band linear amplifier circuits 100, 200 are illustrated in FIG. 7. The gain curve in dashed line shows typical gain fall off with the increase of frequency. In particular, the gain responses at the lower frequency band and upper frequency band show great variations, with severely degraded gain linearity. The gain and phase controls implemented with power, gain and phase sensing in the above described broad-band linear amplifier circuits 100, 200, 300 can effectively flatten the gain response curve in the lower frequency band, mid frequency band and upper frequency band. FIG. 8 illustrates an exemplary application of a broad-band linear amplifier circuit 512 in a wireless communication device 500. The wireless communication device 500 can for example be a PDA, a WLAN adaptor, a cellular phone, or other mobile transmitting device.

The broad-band linear amplifier circuit 512 can be implemented by the broad-band linear amplifier circuit 200 as previously described. The wireless communication device 500 can include a base band processor core 520, an RF transceiver 530, a power amplifier module 510, and a 50-ohm impedance transmission line or micro strip 540 and an antenna 550. The power amplifier module 510 can include the broad-band linear amplifier circuit 512, a Vmode control circuit 514, a sensing circuit 516 for detecting the power, the gain, and the phase of the output signal, a control logic circuit 518, and a power control circuit 519. The control logic circuit 518 can be a linearity controller that provides control signals to gain control circuit (125 in FIGS. 1 and 225 in FIG. 2) and gain control circuit (127 in FIGS. 1 and 227 in FIG. 2). The power amplifier module 510 can therefore amplify input RF signals by via close-loop control. In some embodiments, the power amplifier module 510 is fabricated on an integrated circuit (IC) module that can be implemented on a single semiconductor chip.

The base band processor 520 can generates digitally modulated signals in response to input digital signals. The input digital signals are to be transmitted in different single RF bands in a broad band. The frequency is up-converted by the RF transceiver 530 to RF signals suitable for transmission. The RF signal is amplified by the PA module 510 that produces amplified RF signal for transmission by the antenna 550. The PA module 510 can be turned ON/OFF by the power control signal produced by the power control circuit 519.

In some embodiments, the broad-band linear amplifier circuit 512 can be controlled by an open loop by the base band processor 520 via Vmode control circuit 514. The Vmode control circuit 514 can produce a Vmode control signal to control and internal settings of the biasing circuits (e.g. 250) under the control of the base band processor 520. The base band processor 520 has the knowledge of the digital signal modulation type and the linear output requirement. For example, when the device is transmitting at high power, the Vmode control signal can control the biasing circuit to activate the main power amplifier. When the device is transmitting at low power, the Vmode control signal can control the biasing circuit to activate the auxiliary power amplifier. As a result, power consumption and output distortion can be minimized.

The control logic circuit 518 can receive and process the power-sensing control signal, and output a processed power-sensing control signal to control the broad-band linear amplifier circuit 512. The processed power-sensing control signal can be a function of the quality and/or the magnitude of the amplified radio frequency signals from the broad-band linear amplifier circuit 512. The control logic circuit 518 can improve output linearity of the broad-band linear amplifier circuit 512 by adjusting the bias of the biasing circuits (e.g. 250) in accordance to the actual output power measured by the sensing circuit 516. It can reduce gain saturation and maintain a more constant gain, which can improve the output linearity in a wide power range. Furthermore, the quality of digital communication can also be improved by an external controller that can adjust the amplitude of the input RF signal based the known relationship between digital communication quality and output power level. The control logic circuit 518 can be a linearity controller that provides control signals to gain control circuit (125 in FIG. 1 and 225 in FIG. 2) and gain control circuit (127 in FIG. 1 and 227 in FIG. 2).

The wireless communication device 500 also includes a multi-band filter 180 that can switch the output RF signals to different single RF bands in a broad band. The band switching is controlled by a band control signal from the base band processor 520. The base band processor 520 can produce the band control signal in accordance the intended transmission single RF band of input digital signal. The base band processor 520 is configured to generate digital modulated signals for a single RF band and simultaneously switch the multi-band filter 180 to allow the RF output signals in that single RF band to pass to the antenna 550 for RF transmission.

It is understood the disclosed broad-band linear amplifier circuits can be compatible with other variations without deviating from the spirit of the present application. The multi-band filter can be implemented by different components and under different mechanism from the description above. The disclosed broad-band linear amplifier circuits can operate in frequency ranges and RF bands different the examples used in the specification.

The control of the multi-band filter can also be implemented other control circuit from the ones described above. Moreover, each power amplifier in the broad-band linear amplifier circuit can include more than three or more power amplifiers having different gain factors for amplifying RF signals in different output power ranges. Three or more power amplifiers can be arranged in a parallel circuit after a driver amplifier. The broad-band linear amplifier circuit can include one, or two, or more stages of power amplification. The gain and phase response curves and the output power ranges shown in disclosed figures are meant to be illustration purposes. The disclosed systems and methods are suitable to other gain and phase response characteristics in different power ranges.

The disclosed broad-band linear amplifier circuits are suitable to different wireless modulation schemes such as Orthogonal Frequency-Division Multiplexing (OFDM) and Orthogonal Frequency-Division Multiplexing Access (OFDMA), and various wireless communications standards and protocols, including Global System for Mobile communications (GSM), Universal Mobile Telecommunications Service (UMTS), and Code Division Multiple Access (CDMA). GSM can include GPRS, EDGE and CSD. 3GPP can include Wideband Code Division Multiple Access (WCDMA), High-Speed Packet Access (HSPA), High-Speed Downlink Packet Access (HSDPA), IMT, and Long Term Evolution (LTE). CDMA can include CDMA2000, and Ultra Mobile Broadband (UMB). Suitable wireless communications standards also include 3GPP, IMT-2000, WiMax, WiBro, WiFi, WLAN, 802.16, and others.

What is claimed is:

1. A radio frequency (RF) amplifier circuit, comprising:
   a first impedance matching circuit configured to receive an input RF signal;
   a control circuit configured to produce a band control signal according to the frequency of the input RF signal;
   an RF amplifier having its input connected to the first impedance matching circuit, wherein the RF amplifier is configured to produce an amplified RF signal in response to the input RF signal;
   a second impedance matching circuit configured to receive the amplified RF signal from the RF amplifier, wherein at least one of the first impedance matching circuit and the second impedance matching circuit has an impedance that is adjustable by the band control signal; and
   a multi-band filter comprising a plurality of selectable narrow-band filters, wherein the multi-band filter is configured to direct the amplified RF signal from the second impedance matching circuit to one of the selectable narrow-band filters in response to the band control signal.

2. The RF amplifier circuit of claim 1, wherein the multi-band filter comprises a first selectable narrow-band filter and a second selectable narrow-band filter, wherein the multi-band filter is configured to selectively turn on the first selectable narrow-band filter and to turn off the second selectable narrow-band filter in response to the band control signal.

3. The RF amplifier circuit of claim 2, wherein the first selectable narrow-band filter and the second selectable narrow-band filter are connected in a parallel circuit.

4. The RF amplifier circuit of claim 1, wherein at least one of the first impedance matching circuit and the second impedance matching circuit comprises:
   an inductor having an impedance that is adjustable by the band control signal.

5. The RF amplifier circuit of claim 1, wherein at least one of the first impedance matching circuit and the second impedance matching circuit comprises:
   a capacitor having a capacitance that is adjustable by the band control signal.

6. The RF amplifier circuit of claim 1, wherein at least one of the first impedance matching circuit and the second impedance matching circuit comprises:
   an inductor;
   a capacitor in parallel connection with the inductor; and
   a switch configured to connect or disconnect the capacitor from the parallel connection in response to the band control signal.

7. The RF amplifier circuit of claim 1, wherein at least one of the first impedance matching circuit and the second impedance matching circuit comprises:
   a first capacitor;
   a second capacitor in parallel connection with the first capacitor; and
   a switch configured to connect or disconnect the second capacitor from the parallel connection in response to the band control signal.

8. The RF amplifier circuit of claim 1, wherein at least one of the first impedance matching circuit and the second impedance matching circuit comprises a serial inductor, a serial capacitor, a shunt inductor, or a shunt capacitor, at least one of which having an impedance adjustable by the band control signal.

9. The RF amplifier circuit of claim 1, wherein at least one of the first impedance matching circuit, and the second impedance matching circuit comprises:
   an inductor;
   a capacitor in parallel connection with the inductor; and
   a switch configured to connect or disconnect the capacitor from the parallel connection in response to the band control signal.

10. A radio frequency (RF) amplifier circuit, comprising:
    an input impedance matching circuit configured to receive an input RF signal;
    a control circuit configured to produce a band control signal according to the frequency of the input RF signal;
    a first RF amplifier having its input connected to the input impedance matching circuit, wherein the first RF amplifier is configured to produce a first amplified RF signal in response to the input RF signal;
    a second RF amplifier configured to produce a second amplified RF signal in response to the first amplified RF signal;
    an inter-stage impedance matching circuit coupled between the output of the first RF amplifier and the input of the second RF amplifier;
    an output impedance matching circuit configured to receive the second amplified RF signal from the second RF amplifier, wherein at least one of the input impedance matching circuit, the inter-stage impedance matching circuit, and the output impedance matching circuit has an impedance that is adjustable by the band control signal; and
    a multi-band filter comprising a plurality of selectable narrow-band filters, wherein the multi-band filter is configured to direct the amplified RF signal from the second impedance matching circuit to one of the selectable narrow-band filters in response to the band control signal.

11. The RF amplifier circuit of claim 10, wherein the multi-band filter comprises a first selectable narrow-band filter and a second selectable narrow-band filter, wherein the multi-band filter is configured to selectively turn on the first selectable narrow-band filter and to turn off the second selectable narrow-band filter in response to the band control signal.

12. The RF amplifier circuit of claim 10, wherein at least one of the input impedance matching circuit, the inter-stage impedance matching circuit, and the output impedance matching circuit comprises:
    an inductor having an impedance that is adjustable by the band control signal.

13. The RF amplifier circuit of claim 10, at least one of the input impedance matching circuit, the inter-stage impedance matching circuit, and the output impedance matching circuit comprises:
    a capacitor having a capacitance that is adjustable by the band control signal.

14. The RF amplifier circuit of claim 10, wherein at least one of the impedance matching circuit, and the second impedance matching circuit comprises:
    a first capacitor;
    a second capacitor in parallel connection with the first capacitor; and
    a switch configured to connect or disconnect the second capacitor from the parallel connection in response to the band control signal.

15. The RF amplifier circuit of claim 10, wherein at least one of the input impedance matching circuit, the inter-stage impedance matching circuit, and the output impedance matching circuit comprises a serial capacitor, a serial inductor, a shunt capacitor, or a shunt inductor, at least one of which having an impedance adjustable by the band control signal.

16. The RF amplifier circuit of claim 10, wherein the frequency of the input RF signal is defined by International Mobile Telecommunications (IMT), WiMax, WiBro, WiFi, 3GPP, or IMT-2000.

* * * * *